(12) United States Patent
Van Den Nieuwelaar et al.

(10) Patent No.: US 7,068,351 B2
(45) Date of Patent: Jun. 27, 2006

(54) METHOD OF CONTROLLING A LITHOGRAPHIC PROCESSING CELL, DEVICE MANUFACTURING METHOD, LITHOGRAPHIC APPARATUS, TRACK UNIT, LITHOGRAPHIC PROCESSING CELL, AND COMPUTER PROGRAM

(75) Inventors: Norbertus Josephus Martinus Van Den Nieuwelaar, Tilburg (NL); Johannes Onvlee, 's-Hertogenbosch (NL); Roel Boumen, Venlo (NL)

(73) Assignee: ASML Netherlands B.V., Veldhoven (NL)

( * ) Notice: Subject to any disclaimer, the term of this patent is extended or adjusted under 35 U.S.C. 154(b) by 105 days.

(21) Appl. No.: 10/781,945

(22) Filed: Feb. 20, 2004

(65) Prior Publication Data

US 2005/0185952 A1 Aug. 25, 2005

(51) Int. Cl.
  *G03B 27/42* (2006.01)

(52) U.S. Cl. ............................ 355/53; 355/77; 414/940

(58) Field of Classification Search ................ 430/322, 430/5, 30, 311; 701/23–25; 414/222.01, 414/222.02, 222.03, 222.04, 222.05, 222.06, 414/935–941; 716/21, 22; 250/548; 355/53, 355/77, 72, 75; 396/611, 567–570; 118/52, 118/319, 320, 321; 427/240; 700/117–121, 700/228
See application file for complete search history.

(56) References Cited

U.S. PATENT DOCUMENTS

| | | | | |
|---|---|---|---|---|
| 5,975,740 A | * | 11/1999 | Lin et al. | 700/99 |
| 6,526,329 B1 | * | 2/2003 | Tateyama et al. | 700/213 |
| 6,580,955 B1 | * | 6/2003 | Lin et al. | 700/97 |
| 6,678,572 B1 | * | 1/2004 | Oh | 700/121 |
| 6,698,944 B1 | * | 3/2004 | Fujita | 396/611 |
| 6,766,285 B1 | * | 7/2004 | Allen et al. | 703/22 |

OTHER PUBLICATIONS

Van den Nieuwelaar et al., *"Design of Supervisory Machine Control"*, European Control Conference 2003, 6 pages.
Marc Wennink, *"Algorithmic Support for Automated Planning Boards"*, PhD Thesis, Eindhoven University of Technology, pp. 1-139, (1995).

* cited by examiner

*Primary Examiner*—D. Rutledge
(74) *Attorney, Agent, or Firm*—Pillsbury Winthrop Shaw Pittman, LLP

(57) ABSTRACT

A method of controlling a track apparatus in a lithocell apparatus arrangement, is presented herein. The lithocell includes a lithographic exposure apparatus configured to expose substrates and a track apparatus configured to prepare substrates before exposure and develop substrates after exposure. The method includes predicting times at which the lithographic exposure apparatus will be available to accept a prepared substrate for exposure from the track apparatus, and adjusting a rate at which the track apparatus prepares substrates so that a substrate is prepared in time for acceptance by the lithographic exposure apparatus. By adjusting the track rate so that substrates are ready just as the lithographic exposure apparatus needs them, the use of the buffer in the track can be largely avoided or even eliminated entirely.

31 Claims, 11 Drawing Sheets

METHOD OF CONTROLLING A LITHOGRAPHIC PROCESSING CELL, DEVICE MANUFACTURING METHOD, LITHOGRAPHIC APPARATUS, TRACK UNIT, LITHOGRAPHIC PROCESSING CELL, AND COMPUTER PROGRAM

BACKGROUND OF THE INVENTION

1. Field of the Invention

The present invention relates to lithographic processing cells, comprising a lithographic apparatus and a track apparatus, and associated device manufacturing methods.

2. Description of the Related Art

Lithographic apparatus can be used, for example, in the manufacture of integrated circuits (ICs). In such a case, a patterning device may be used to generate a desired circuit pattern corresponding to an individual layer of the IC, and this pattern can be imaged onto a target portion (e.g. comprising one or more dies) on a substrate (silicon wafer) that has been coated with a layer of radiation-sensitive material (resist).

In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti-parallel to this direction.

In a factory, commonly referred to as a "fab" or "foundry", in which semiconductor devices are manufactured, each lithographic apparatus is commonly associated with a track apparatus, comprising wafer handling devices and pre- and post-processing devices. Such an arrangement forms a lithographic processing cell or "lithocell". Both the lithographic apparatus and the track apparatus have supervisory control systems which are themselves under the control of a further supervisory control system. Wafers, which may be blank or have already been processed to include one or more process or device layers, are delivered to the lithocell in lots (also referred to as batches) for processing.

A lot is, in general, a group of wafers which are to processed by the lithocell in the same way and is accompanied by two "recipes" which specify the processes to be carried out by the track apparatus and by the lithographic apparatus. The lot size may be arbitrary or determined by the size of carrier used to transport substrates around the fab.

The recipe may include details of the resist coating to be applied, temperature and duration of pre- and post-exposure bakes, details of the pattern to be exposed and the exposure settings for that, developments duration, etc.

A large number of tasks must be performed to complete the recipe for a given batch and there are many possible ways these can be done, as in many cases both the track and lithographic apparatus are capable of performing multiple tasks at once, e.g. if the track apparatus includes multiple spin coaters or multipurpose stations or if the lithographic apparatus is a dual stage apparatus having measurement and exposure stations. Thus scheduling the tasks to be performed, and optimizing that schedule to maximize throughput, is a complex task.

A new approach to scheduling is described in European Patent Application No. 03256456.9 filed 13 Oct. 2003 and U.S. patent application Ser. No. 10/743,320 filed 23 Dec. 2003, which documents are hereby incorporated by reference. The approach described in these documents is model and state-based and may be applied to the whole or parts of a track apparatus unit or a lithographic apparatus as well as to the lithocell as a whole.

In the case where separate control systems and scheduling are provided for the track apparatus and the lithographic apparatus, there is a need for synchronization of the track apparatus and scanner, to ensure that the track apparatus is able to deliver an unexposed resist-coated wafer and receive an exposed wafer as required by the lithographic apparatus. The throughput of wafers, which will generally be greater than 100 wafers per hour, must be maximized to reduce the cost of ownership of the lithographic apparatus, which has a high capital cost. Normally, throughput is limited by the rate at which the lithographic apparatus can expose wafers and the track apparatus is arranged to operate a little faster than the lithographic apparatus so that there is always a prepared wafer waiting to be taken by the lithographic apparatus. A buffer is provided in the track apparatus to accommodate the waiting wafers. However, the present inventors have determined by investigation and experimentation that this approach does not always provide maximum throughput.

SUMMARY OF THE INVENTION

The principles of the present invention, as embodied and broadly described herein, provide an improved approach to the synchronization of the track apparatus and lithographic apparatus in a lithocell arrangement to maximize throughput. In one embodiment, the method comprises predicting times at which the lithographic exposure apparatus will be available to accept a prepared substrate for exposure from the track apparatus, and adjusting a rate at which the track apparatus prepares substrates so that a substrate is prepared in time for acceptance by the lithographic exposure apparatus.

By adjusting the work rate of the track apparatus so that substrates are ready just as the lithographic apparatus needs them, the use of the buffer in the track can be largely avoided or even eliminated entirely. It has been determined that the use of the buffer can introduce irregular delays and reduce throughput of the overall system. This is because the actions of loading a substrate into the buffer and out again take additional time and are unproductive. Also, when the lithographic apparatus is ready to receive a prepared substrate, there may be one waiting in the buffer but the track robot may be occupied with a transfer in another part of the track and unable to service the lithographic apparatus' need for a new substrate.

There is therefore a delay in the delivery of the substrate. Depending on the exact relationship of the cycle times of the track apparatus and the lithographic apparatus, theses delays can lead to instability of the overall cycle time and throughput. As well as reducing throughput, such variability can result in variation of the length of time the substrates spend in time-critical processes, such as the post-exposure bake, leading to variation in the quality of the exposed and developed substrates. Such variability can be eliminated at the cost of throughput by increasing the cycle time of the track to be greater than that of the lithographic apparatus but the present invention can provide reduced variability without loss of throughput by matching the substrate delivery time by the track to the demand of the lithographic apparatus. The invention therefore provides better productivity more stable Post Exposure Bake times.

The timing of preparation of substrates by the track apparatus can be adjusted in any convenient way, by adjusting the timing of a convenient step in the preparation. In many cases, the "recipe" which the track is following will include time-critical steps whose duration must remain fixed and the adjustment of the track timing will take this into account. In the event that all steps of the recipe are time-critical or there is insufficient room for adjustment, the necessary adjustment can be made by delaying the times when wafers are taken up by the track apparatus.

The prediction of the times when the lithographic apparatus will be ready to accept a new wafer is preferably based on a calculated schedule for the future steps to be carried out by the lithographic apparatus. This schedule may be calculated by the methods described in U.S. patent application Ser. No. 10/743,320, referred to above. The times taken for the execution of this schedule may be calculated using a model of the machine incorporated in control software. The use of schedules that will be carried out and a model to calculate execution times provides the most accurate prediction of timings and hence the greatest advantage. However, other approaches to prediction, such as statistical or empirical data, may be employed if sufficiently accurate.

In addition to the timings that the lithographic apparatus will be ready to receive a new substrate, it is preferable to also predict the timings when it will deliver an exposed substrate so as to ensure that the track robot will be free to unload the exposed wafer.

In a preferred embodiment of the invention, the rate of working of the track apparatus unit is adjusted in response to a predicted demand timing for the substrate at least N ahead of the substrate most recently accepted by the lithographic apparatus, where N is the number of wafers undergoing preparation in the track. This ensures that the timing is adjusted sufficiently far in advance to accommodate changes in the work rate of the lithographic apparatus without delay. Such changes may occur in the event of recipe changes between batches or lots of wafers.

Other aspects of the present invention include a lithographic apparatus adapted to provide predictions of the times when it will be ready to accept wafers, a track apparatus unit adapted to vary its work rate in response to predictions, a lithocell adapted to operate according to the method(s) described above, a computer program product adapted to control a lithocell to perform the above described methods and a device manufacturing method in which the above described methods are employed.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively.

The substrate referred to herein may be processed, before or after exposure, in for example a track apparatus (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5–20 nm), as well as particle beams, such as ion beams or electron beams.

The term "patterning device" used herein should be broadly interpreted as referring to means that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

Patterning devices may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of patterning device, the support structure may be a frame or table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF DRAWINGS

Embodiments of the invention will now be described, by way of example only, with reference to the accompanying schematic drawings in which corresponding reference symbols indicate corresponding parts, and in which.

DETAILED DESCRIPTION OF THE INVENTION

Lithographic Apparatus

Figure 1:
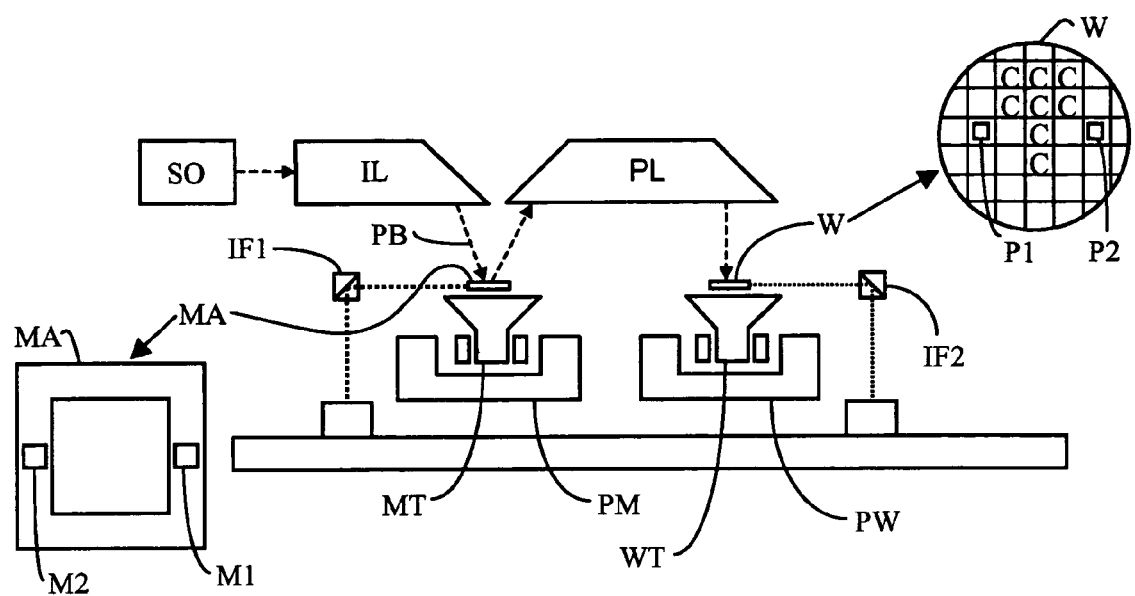
FIG. 1 depicts a lithographic apparatus according to an embodiment of the invention.

FIG. 1 schematically depicts a lithographic apparatus according to a particular embodiment of the invention. The apparatus comprises:

- an illumination system (illuminator) IL: for providing a projection beam PB of radiation (e.g. UV or EUV radiation).
- a first support structure (e.g. a mask tablelholder) MT: for supporting patterning device (e.g. a mask) MA and connected to first positioning mechanism PM for accurately positioning the patterning device with respect to item PL;
- a substrate table (e.g. a wafer table/holder) WT: for holding a substrate (e.g. a resist-coated wafer) W and connected to second positioning mechanism PW for accurately positioning the substrate with respect to item PL; and
- a projection system (e.g. a reflective projection lens) PL: for imaging a pattern imparted to the projection beam PB by patterning device MA onto a target portion C (e.g. comprising one or more dies) of the substrate W.

As here depicted, the apparatus is of a reflective type (e.g. employing a reflective mask or a programmable mirror array of a type as referred to above). Alternatively, the apparatus may be of a transmissive type (e.g. employing a transmissive mask).

The illuminator IL receives a beam of radiation from a radiation source SO. The source and the lithographic apparatus may be separate entities, for example when the source is a plasma discharge source. In such cases, the source is not considered to form part of the lithographic apparatus and the radiation beam is generally passed from the source SO to the illuminator IL with the aid of a radiation collector comprising for example suitable collecting mirrors and/or a spectral purity filter. In other cases the source may be integral part of the apparatus, for example when the source is a mercury lamp. The source SO and the illuminator IL, may be referred to as a radiation system.

The illuminator IL may comprise adjusting mechanism for adjusting the angular intensity distribution of the beam. Generally, at least the outer and/or inner radial extent (commonly referred to as σ-outer and σ-inner, respectively) of the intensity distribution in a pupil plane of the illuminator can be adjusted. The illuminator provides a conditioned beam of radiation, referred to as the projection beam PB, having a desired uniformity and intensity distribution in its cross-section.

The projection beam PB is incident on the mask MA, which is held on the mask table MT. Being reflected by the mask MA, the projection beam PB passes through the lens PL, which focuses the beam onto a target portion C of the substrate W. With the aid of the second positioning mechanism PW and position sensor IF2 (e.g. an interferometric device), the substrate table WT can be moved accurately, e.g. so as to position different target portions C in the path of the beam PB. Similarly, the first positioning mechanism PM and position sensor IF1 can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning mechanism PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

- step mode: the mask table MT and the substrate table WT are kept essentially stationary, while an entire pattern imparted to the projection beam is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.
- scan mode: the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.
- other mode: the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

EMBODIMENTS

Figure 2:
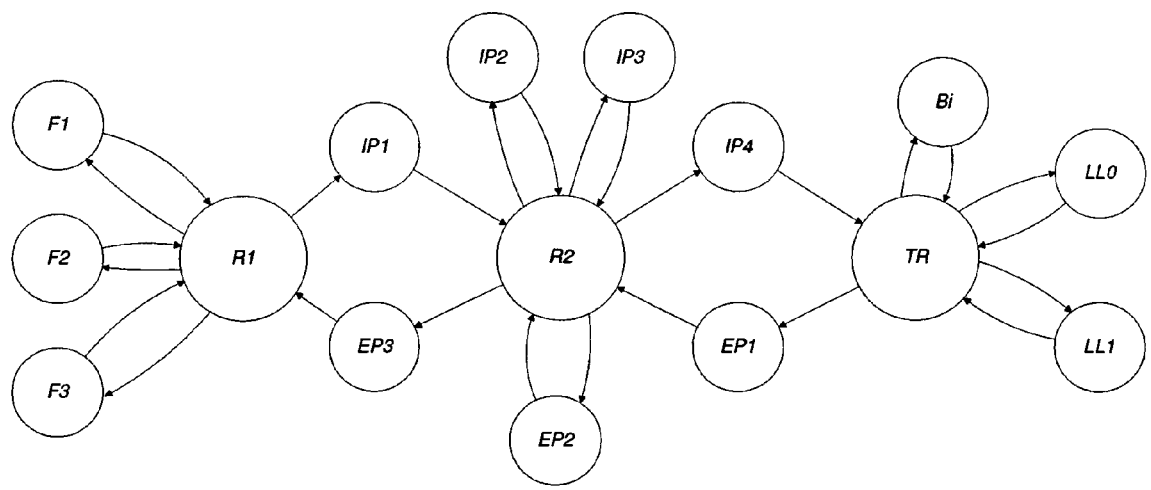
FIG. 2 depicts the processes carried out by a track apparatus unit according to an embodiment of the invention.

The track apparatus will now be described by way of explaining the processes it performs, which are illustrated in FIG. 2.

First the wafer (substrate) is picked up by a robot R1 from one of the three cassettes (known as "foups") F1 through F3 at the beginning of the track apparatus. This wafer is then processed by a few resources IP1 through IP4 and robot R2. These processes may include coating and temperature stabilization of a wafer. The incoming path of the wafer is from the foup to resource IP4. The wafer is picked up from the last resource by the track robot TR and brought to one of the load locks LL0 or LL1 of the lithographic apparatus. If neither of the load locks is ready to receive the wafer, the wafer is placed in the input buffer BI by the track apparatus robot. The TR then tries to pick up an exposed wafer from one of the load locks and brings it to the exit process (EP1). Here the wafer is processed by a few other resources EP1 through EP3 and transported by R2. These processes may include development and baking of the wafer. Then the wafer is brought back to the right foup by R1. The number, type and duration of the process carried out by the track apparatus will depend on the recipe it is following.

The last input process may be time critical and in that case should be serviced by the track robot the moment a wafer is ready. The track apparatus follows the FIFO rule and the track robot has a cyclical behavior. This means that the track apparatus has a window in which it can service a load lock. As can be seen in FIG. 2, the track apparatus has an input and an output flow. These flows are coupled by shared resources, the robots.

Figure 3:
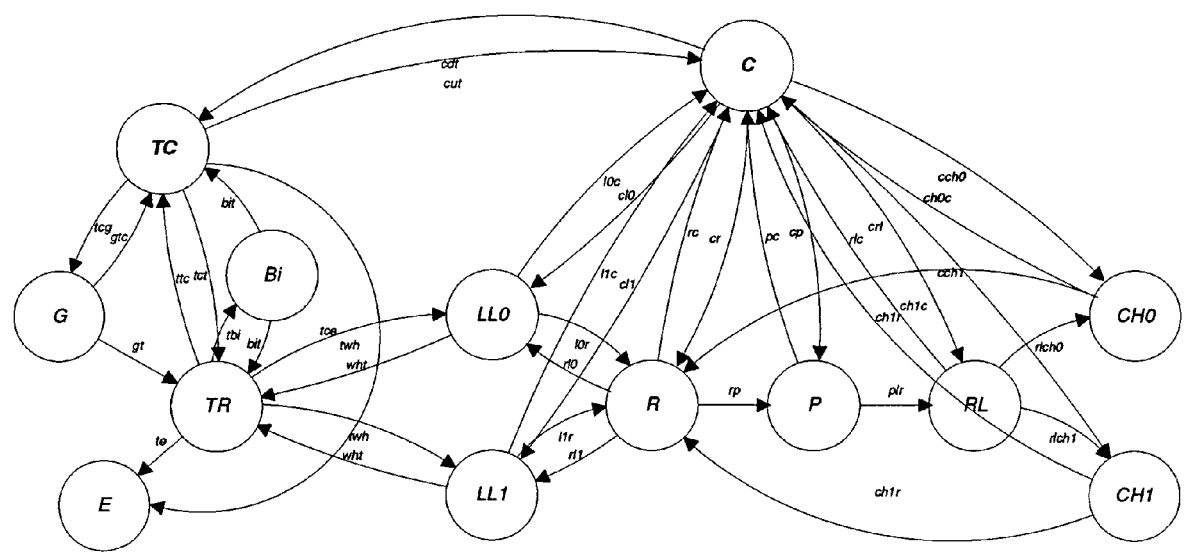
FIG. 3 depicts the processes carried out by a lithocell, with some track apparatus processes simplified.

For the purposes of the present invention, the detailed structure and working of the track apparatus are not important, so below a simplified model of the track apparatus is referred to. This is shown in the left hand side of FIG. 3, which also shows the resources and process flows of the lithographic apparatus. The preconditioning of the wafer has been placed in one process, Generator G. The development of the wafer has also been placed in one process, Exit E. So processes F1 through F3 and IP1 through IP4 are modeled in process G and processes EP1 through EP3 and F1 through F3 are modeled in process E. The track robot, TR, and the track buffer BI are separately implemented in the model.

For this model, the tasks of the track robot are set out in Table 1. The real track schedules the jobs of the track robot. Because the model of the track is kept simple, the TR may have a cyclic control: it serves the processes in the figure clockwise. This means that the robot rotates clockwise and performs the jobs which are ready always in the same order. Also the track robot follows the FIFO rule, meaning when a wafer is laid in the buffer the TR has to put the next wafer in the buffer and get the previous wafer out.

TABLE 1

Track Robot Tasks

| Task | Task description |
|---|---|
| 0 | Receive wafer from G and turn to Bi |
| 1 | Send wafer to Bi |
| 2 | Rotate to LL0, and send the wafer to LL0 |
| 3 | Rotate to LL1, and send the wafer to LL1 |
| 4 | Send wafer to Bi, receive wafer from Bi, rotate and send wafer to LL0 |
| 5 | Send wafer to Bi, receive wafer from Bi, rotate and send wafer to LL1 |
| 6 | Receive wafer from Bi, rotate and send wafer to LL0 |
| 7 | Receive wafer from Bi, rotate and send wafer to LL1 |
| 8 | Receive wafer from a LL |
| 9 | Rotate and send wafer to E |
| 10 | Rotate from LL to G |
| 11 | Rotate from G to Bi |
| 12 | Rotate from Bi to LL |

In an existing apparatus, communication between the track apparatus and the lithographic apparatus is performed as follows. The lithographic apparatus can send two signals and the track apparatus can send two signals. If the lithographic apparatus requests a wafer, the first signal is put high so the track control knows that it has to deliver a wafer. When the track apparatus delivers a wafer, track control puts its first signal high. When the transfer is ready, track control puts its signal low and the lithographic apparatus puts its signal low. The same communication happens when a wafer is delivered by the load lock of the lithographic apparatus, but now the remaining two signals are used.

A difference between this known system and the present invention is that servicing a load lock mechanism delivering and picking up a wafer by the track robot TR. There are two ways the track control can decide whether or not to service the load lock: (a) at the moment the track robot arrives at the buffer it looks at both load locks to see if one of them can be serviced, or (b) the track robot stays as long as possible at the buffer to wait on a ready signal of one of the load locks. The first type of decision is called the immediate decision. The second type of decision is called the window decision, while the track robot has a window it can wait for a load lock. This window is determined by the process time of generator G and the process time of track robot TR, from the moment it can service a load lock LL0,1 to the moment it reaches G.

Using this model, the effects of variations of the cycle times of the track apparatus T and lithographic apparatus LA can be demonstrated.

In a first demonstration, the cycle time of the track is set to at 140 [wph], meaning an exposure time of 24.7 [sec](+1 sec swap time). The cycle time of the track is varied by changing the generator time of G and the process time of E (these are coupled and equal). The upper boundary of the generator time is 19.2 seconds. TR needs this time to complete one cycle. If the generator time were faster, TR cannot service a LL because G is time critical. The lower boundary is 30 [sec], which is an arbitrary chosen boundary, sufficient to see all effects. The G and E process times are increased with 0.1 seconds per step. During each step 150 wafers are produced and the average throughput T is calculated over the wafers 25 to 125. The filling and emptying behavior of the system are not taken into account. The experiment is carried out for both immediate decision and window decision control techniques and the results are shown in FIG. 4.

Figure 4:
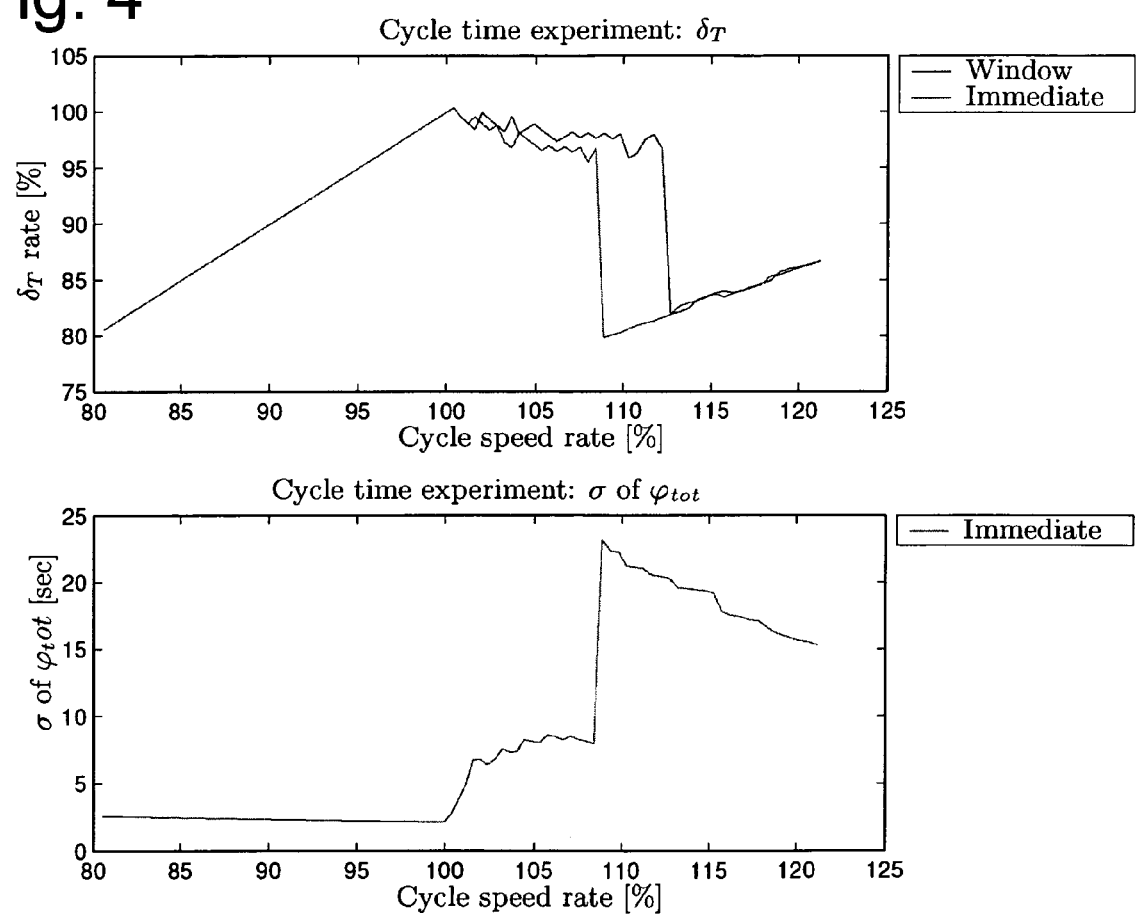
FIG. 4 depicts the variation of the throughput rate of the lithocell and the standard deviation of the post-exposure bake time with track apparatus cycle time relative to the lithographic apparatus cycle time in the prior art.
Figure 5:
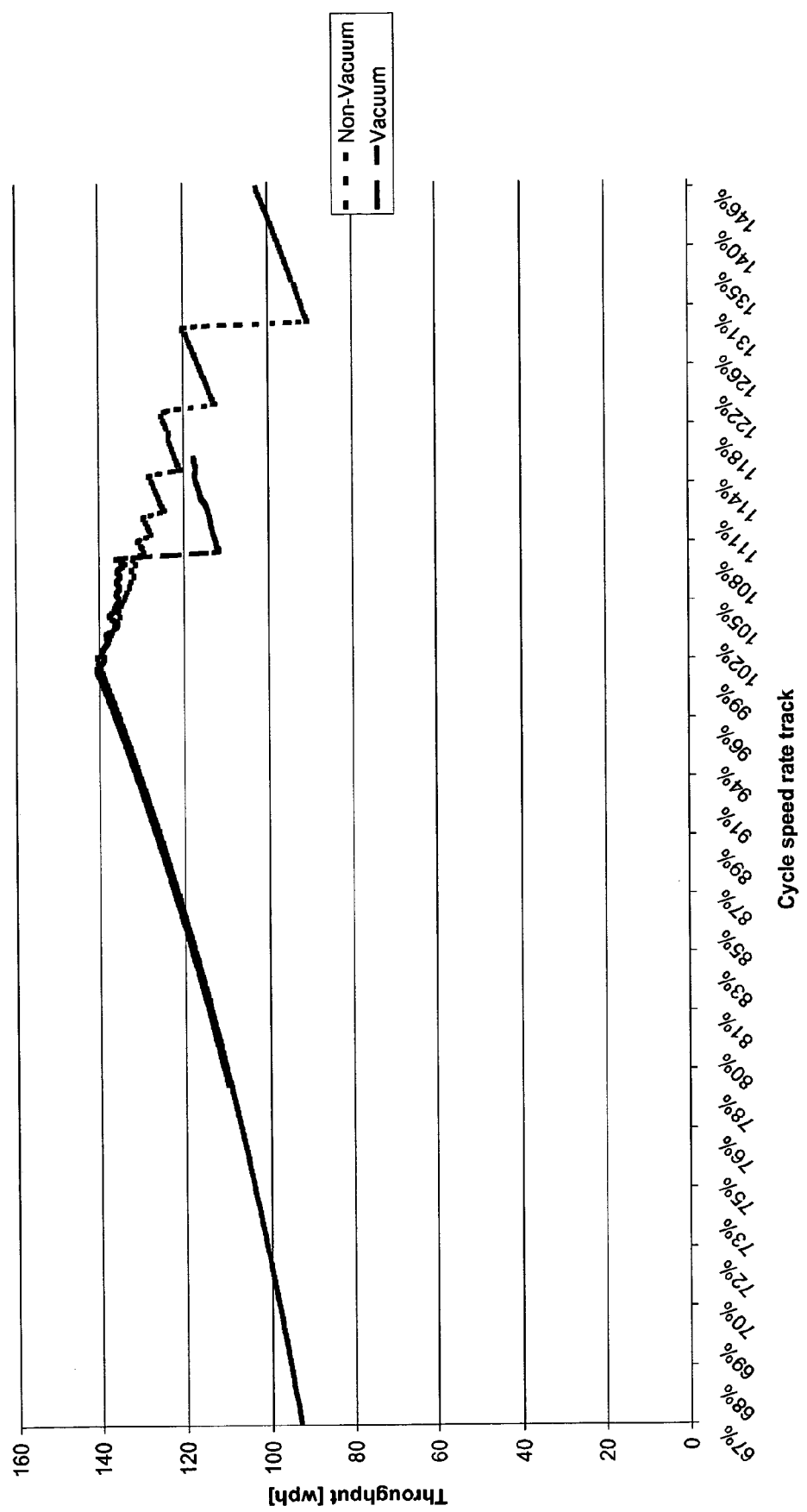
FIG. 5 depicts variation of throughput rate with track apparatus cycle time for two further prior art apparatus.

In FIG. 4, the first graph shows the cycle speed rate. The throughput rate is the measured throughput divided by the maximal throughput at the exposure process. The cycle speed rate is the cycle time of the lithographic apparatus divided by the cycle time of the track multiplied by 100 percent. The cycle speed rate is chosen as parameter instead of the cycle time, to prevent a confusion. If the speed of T increases, for example from 95 to 100% of the speed of the lithographic apparatus, this means that the track T becomes faster. If the cycle time was used as parameter, an increase of time would mean a slower track. The 100% position on the x-axis indicates that the cycle times of track and lithographic apparatus are equal. The 100% position on the y-axis indicates that the measured throughput is equal to the maximal throughput that can be achieved by the exposure process. FIG. 5 shows throughput variation with relative track cycle speed (as a percentage of the speed of the lithographic apparatus) for two further apparatus, one a vacuum apparatus using load locks and the other a dual stage non-vacuum apparatus.

In the second graph of FIG. 4 the standard deviation σ of the post exposure bake (PEB) σ of φ tot is shown as function of the normalized cycle speed (cycle speed rate) for the experiment with the immediate decision technique. In the following, the term PEB is used to refer to the time between completion of exposure and the substrate exiting the scanner. Strictly, the term should refer to the time between completion of exposure and the start of the bake, i.e. including time spent in the track before the bake starts.

The graphs show that the throughput of the system depends on the cycle speed of the track. In the first graph in FIG. 4 some interesting results can be seen. The graph can be split in three areas. The first area is from 80 to 100% cycle speed rate, the second from 100 to 108% cycle speed rate for the immediate decision and the third from 108% cycle speed rate and further. The areas are described below.

Until the cycle speed of the track T has reached the cycle speed of the lithographic apparatus (100%), the throughput of the system is bounded by the cycle speed of the track T. Therefore the through-put line increases almost linearly to the cycle speed of the track.

If the cycle speed of the track increases over 100%, the throughput line shows a plateau, which is wider for the experiment with the window decision. This plateau shows a small decline of the throughput and some disturbances.

If the cycle speed increases more, the throughput drops about 15% and the plateau ends. After this point, the throughput increases again as the track becomes faster.

The second graphs in FIG. 4 and FIG. 5 also show the three areas mentioned above. The standard deviation (σ) of the PEB should be as small as possible. The σ in the first area of the graph, is about 3 seconds and is slowly declining. In the second area of the graph, the plateau discussed above, the σ rises from 6 to 9 seconds which is just inside the guidelines. In the last area, σ increases in one step to 23 seconds and declines slowly further.

By looking at the first graph in FIG. 4, a few conclusions can be drawn. The cycle speed of the T should be somewhere between 95 and 112% of the cycle speed of the lithographic apparatus system for the window experiment. And between 95 and 108% for the immediately experiment to achieve a throughput between 95 and 100% of the maximal through-put.

By giving the T a time window to service lithographic apparatus, the plateau increases. The optimum point for the cycle speed of T is 100 percent. The throughput in this optimum point is equal to the maximal throughput of the exposure process.

By looking at the second graph in FIG. 4, some further conclusions can be drawn. The best σ is achieved when the T is slower then the lithographic apparatus. This means that the plateau is not a good working area, while this was suggested in the conclusions above. The working area of the track has to be between 95 and 100% to achieve a throughput between 95 and 100% and a good σ. The increasing of the plateau does therefore not contribute to the increasing of the working area of the T.

Summarizing, in the first area, T is the bottleneck of the system and therefore it determines the throughput. The throughput line therefore rises to one hundred percent and the standard deviation of the PEB is quite constant and small.

In the second area, T is a bit faster than the lithographic apparatus. The following event occurs: the track will miss one service cycle in a number of wafers because it is to fast. This because the G process is time critical. When the track robot for the first time has to service a LL, it has some slack. However, the next time this slack is smaller because the lithographic apparatus is slower. After a number of wafers, the track cannot service the LL because the G process brings a new wafer. The TR services now the G process and skips the LL. This causes a small dip in the mean throughput and quite a large rise in the σ of the PEB. If the track gets faster, the number of wafers between the cycle misses of the track gets smaller. Therefore, the mean throughput at the plateau decreases a bit and the σ of the PEB increases. Because the mean throughput is calculated over a relative small number of wafers, the disturbances at the plateau can be explained; at some moments more cycle misses within the number of wafers occur than on other moments.

The turning point 108% in the third area is now explained. The track is so fast that it always misses a cycle, except when it missed the previous cycle and LL is waiting to be serviced. This means that T needs two cycles to service one LL. This of course is very inefficient and explains the drop of 15% in the throughput, and the rise of the σ of the PEB with 15 seconds. When T becomes faster, the track still needs two cycles for servicing one LL. But here the cycles of T are faster, so the throughput rises and the σ decreases. If T could run infinitely fast, the throughput would rise to the maximal throughput and the a of the PEB would decrease almost to zero.

To investigate the behavior of the lithocell when processing multiple lots, some further experiments were performed. Changing a lot can mean four differences for the system. The exposure time of a new lot can be different than the exposure time of the previous lot. A new lot may require another mask. This means, there should be a mask swap which requires time. The measurement system in the wafer stage may be calibrated during a lot change. The process time of a wafer in the track changes. This is not taken into account for simplicity.

In Table 2, 10 different standard lots with each its own exposure time, calibration time and masks have been defined. The second last column shows the maximum throughput at the wafer stage. Changing a reticle adds 20 seconds to the process time of the first wafer of a lot. The last column shows the total lot overhead delay, this is the total delay the first wafer of that new lot would get, when processing the lots in this order (1,2, . . . ,10 etc). The number of wafers per lot can differ however, a standard lot size in the first simulations is 15 wafers. Further, TC makes use of the window decision discussed above.

TABLE 2

Standard Lots

| Lot [id] | Exposure time | Calibration time | Reticle [id] | Max $\delta_{ws}$ | Total lot overhead |
|---|---|---|---|---|---|
| 1 | 30 [sec] | — | 1 | 116 [wph] | — |
| 2 | 25 [sec] | 5 [sec] | 1 | 138 [wph] | 5 [sec] |
| 3 | 30 [sec] | 5 [sec] | 2 | 116 [wph] | 25 [sec] |
| 4 | 25 [sec] | 10 [sec] | 3 | 138 [wph] | 30 [sec] |
| 5 | 40 [sec] | — | 4 | 87.8 [wph] | 20 [sec] |
| 6 | 25 [sec] | 5 [sec] | 5 | 38 [wph] | 25 [sec] |
| 7 | 40 [sec] | 10 [sec] | 5 | 87.8 [wph] | 10 [sec] |
| 8 | 35 [sec] | 5 [sec] | 3 | 100 [wph] | 25 [sec] |
| 9 | 30 [sec] | 20 [sec] | 3 | 116 [wph] | 20 [sec] |
| 10 | 25 [sec] | 5 [sec] | 6 | 138 [wph] | 25 [sec] |

From the experiments described above, it has become clear that the cycle speed of the track should be the same or a bit slower than the cycle speed of the lithographic apparatus. Therefore, if the exposure time of the track changes, the cycle time of the track should also change after generating the sixth wafer. At that moment, the first wafer of the lot arrives at the exposure process and the cycle time of the lithographic apparatus changes.

However, this approach is not correct when the track has wafers in the input buffer. For example, if there are two wafers in the buffer it takes eight instead of six wafers before the cycle time of T has to change. Therefore, in the following experiments the cycle time of the track is changed as follows. When WS notices a new wafer of a new lot, it signals C the new exposure time of that new lot. C then communicates to TC the new cycle time, where after TC determines a new generator time and exit time. With this approach the number of wafers in the buffer is irrelevant.

Figure 6:
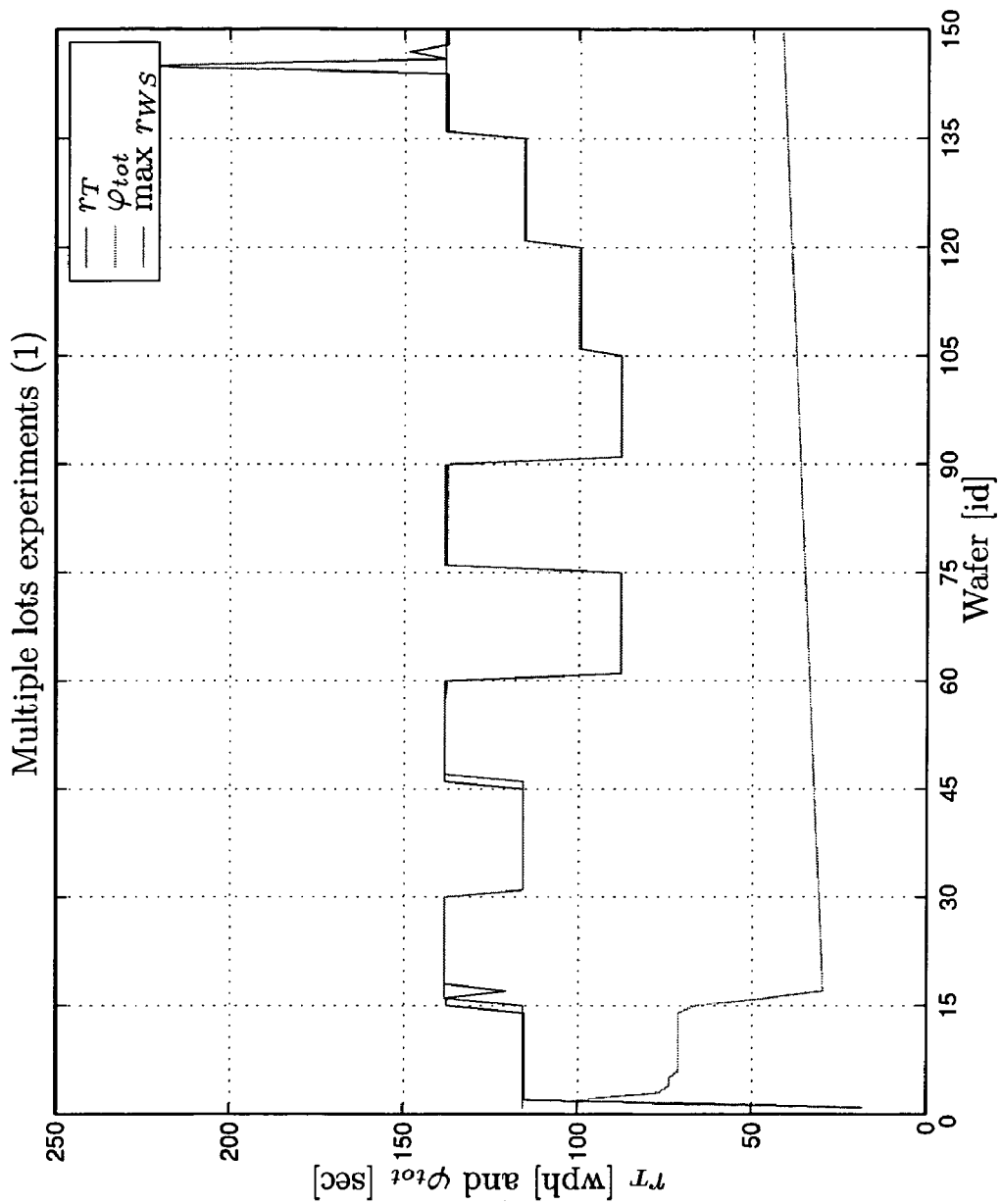
FIG. 6 depicts simulation results for an experiment to determine throughput rates of multiple lots, neglecting lot overhead times.

In the first experiment, just the cycle time adjustment of T is investigated. Therefore, there are no calibrations and reticle swaps, during a lot overhead. The 10 standard lots with each 15 wafers are produced after each other. The results are shown in FIG. 6. The graph shows three lines: the throughput at the end of the track, the maximal throughput at the exposure and the PEB time. From this graph some conclusions can be drawn.

The real throughput line follows the maximal throughput line almost completely. This means that wafers overlap. In the last lot there is a peak in the throughput line, at that moment the generator stops generating wafers. This means that for that wafer, TR is earlier at the load lock. The inter-departure rate is therefore, high for only one wafer. The PEB drops after the first lot to a lower value and stays almost constant. However, there is a small slope in the PEB.

Figure 7:
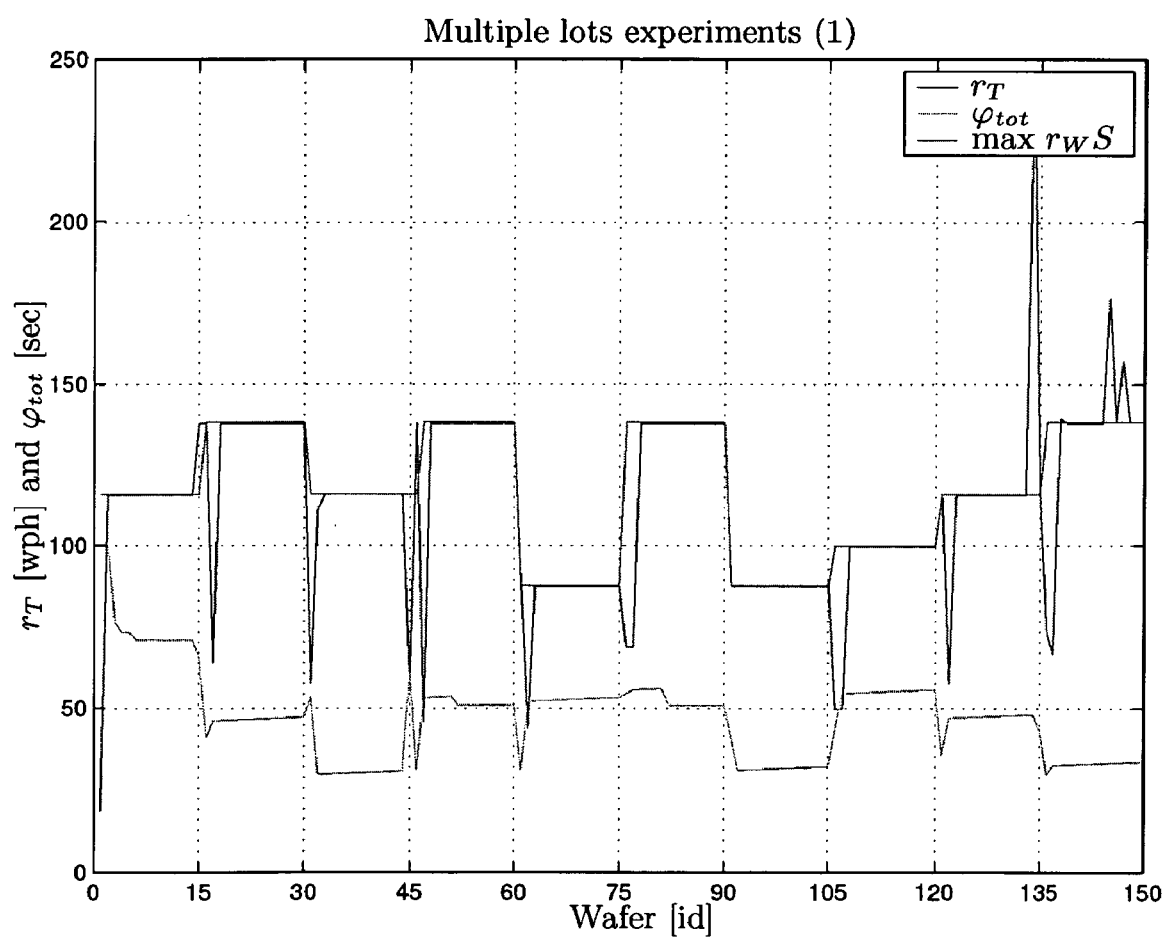
FIG. 7 depicts results of simulations similar to those of FIG. 5 but taking account of lot overhead times.
Figure 8:
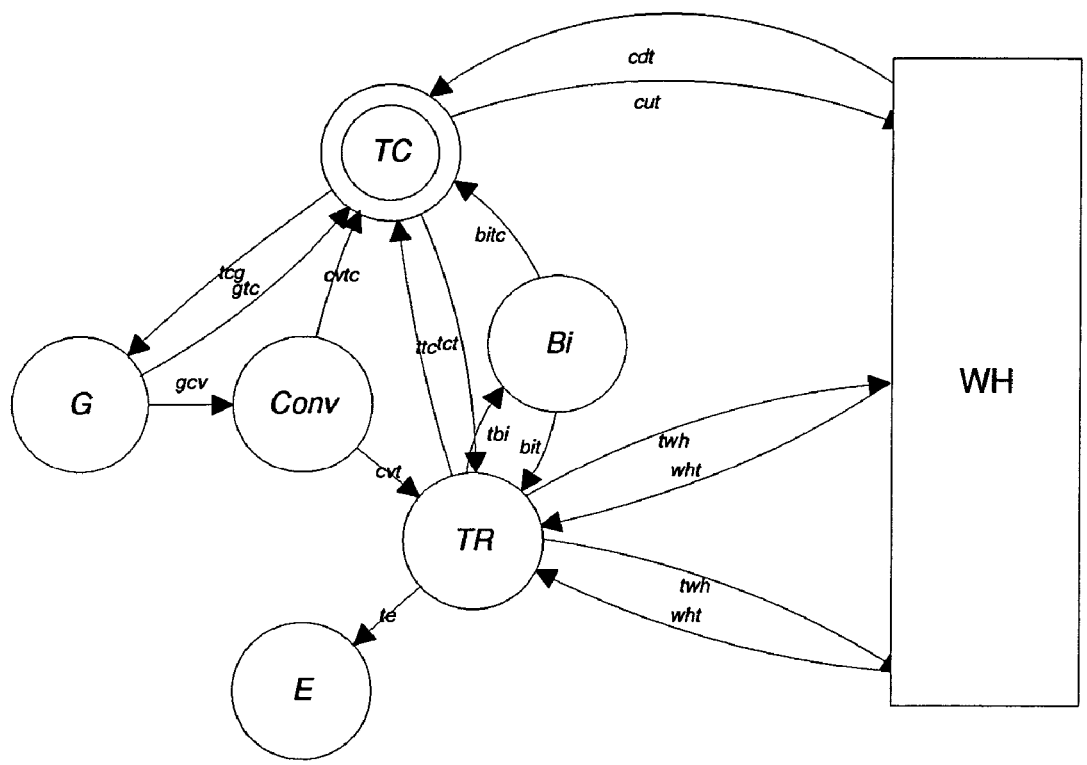
FIG. 8 depicts processes carried out by the track apparatus with certain processes simplified but taking into account time critical steps.

The same experiments but now with lot overhead times are performed. The results are shown in FIG. 7.

The results of the experiment are discussed below:

The throughput line does not follow the maximal throughput line at a lot change. Because the first wafer of a lot has an extra delay, the inter departure rate drops for that single wafer. Also, because LL is late, T skips one cycle and the buffer of T gets filled.

There is a peak in the throughput at wafer 135. At this moment the generator stops generating and TR is emptying the buffer. A second peak occurs when the buffer is empty and TR just takes wafer out of the system.

During a lot change, the PEB shows some peaks for the first few wafers. This is quite logical as the system is brought out of phase. However, each lot has its own plateau of the PEB and these plateaus change in value. This is remarkable, because without lot overhead the plateaus do not shift. This is caused by the disturbances which occur in the system through lot overhead.

As can be seen from the results, it is possible to achieve a good throughput by adjusting cycle speed of the track during a lot change. However, one of the assumptions is that the track speed can be adjusted immediately. This is something which cannot be realized in real machine behavior.

The track speed cannot be changed immediately because the input processes IP1 through IP4, in FIG. 2, contain a number of steps which are time critical and therefore have to be processed. The cycle speed can only be adjusted at the first robot R1. Meaning, there is a delay before this change in cycle speed has run through the machine to the interaction area with the WHO. The model of the track used above is therefore not accurate. By extending this model with a "conveyer" between the generator and the track robot, it will have a more realistic behavior. The conveyor is an abstraction of the modules in the track and models the time required from entering the track to reach the track robot. This behavior only changes in case of multiple lots. Therefore, the results obtained from previous simulations are still correct. In FIG. 7, the new model of the track is visualized.

The generator at the beginning of the conveyer is the same as the previous G process only now, it delivers wafers to the conveyer. The conveyer transports the wafers for a certain time and delivers the wafers to the track robot. The conveyer is time critical and has to be serviced by TR. At the moment TR takes a wafer of the conveyer, it asks the time on which the next wafer arrives. TC can then calculate the next maximal window for the window decision discussed above. The time spent on the conveyer by a wafer is actually the process time of the track. This time is different for each lot however, to keep the model simple it is assumed that this time stays constant. The conveyer holds 15 wafers, when the throughput of the system is 138 [wph]. This means that the process time is: 360 [sec](=15 wafers*24.09 sec G time at 138 [wph]). This is an assumption which is not relevant to the results found. The occurrence of the delay is more important than the size of the delay.

Figure 9:
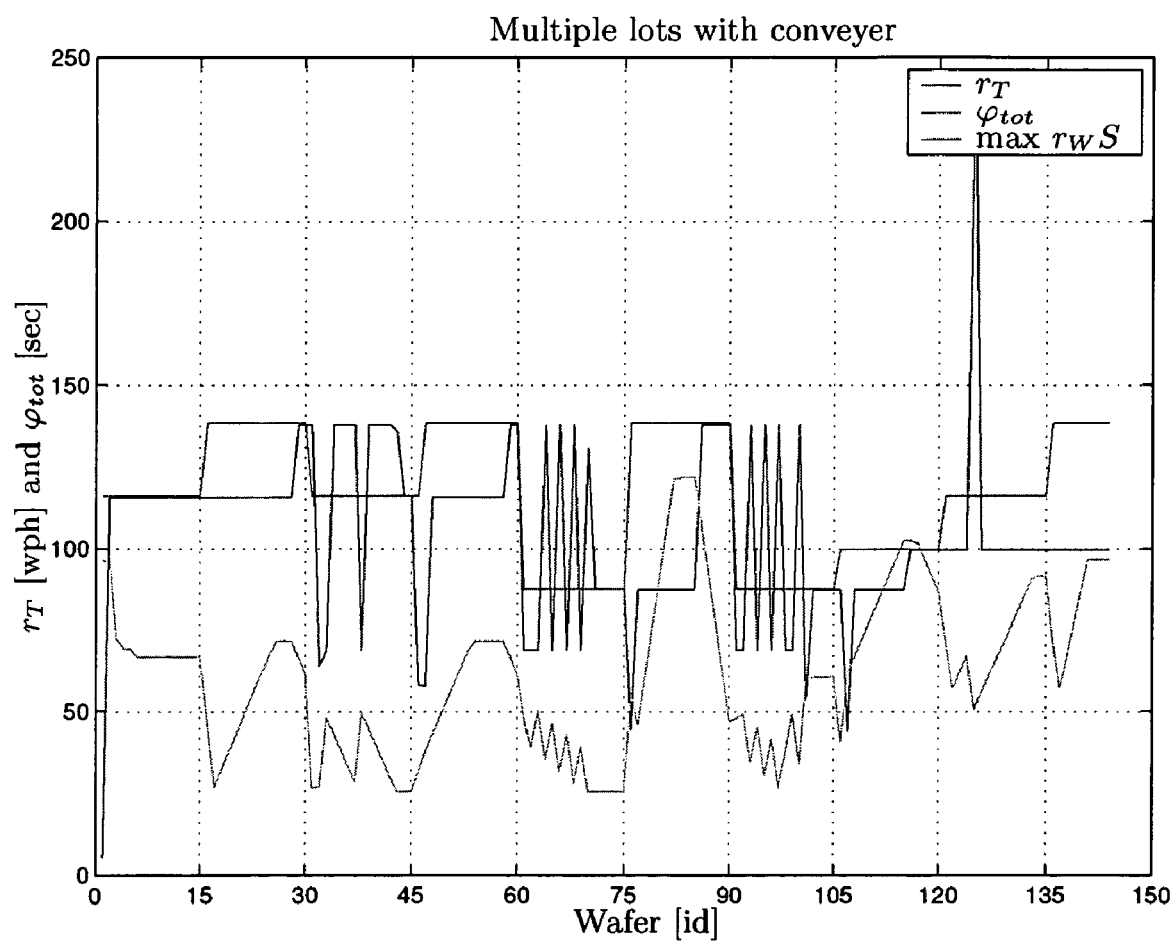
FIG. 9 depicts results of simulations similar to those of FIGS. 5 and 6 but taking account of lot overhead times and time critical steps.
Figure 10:
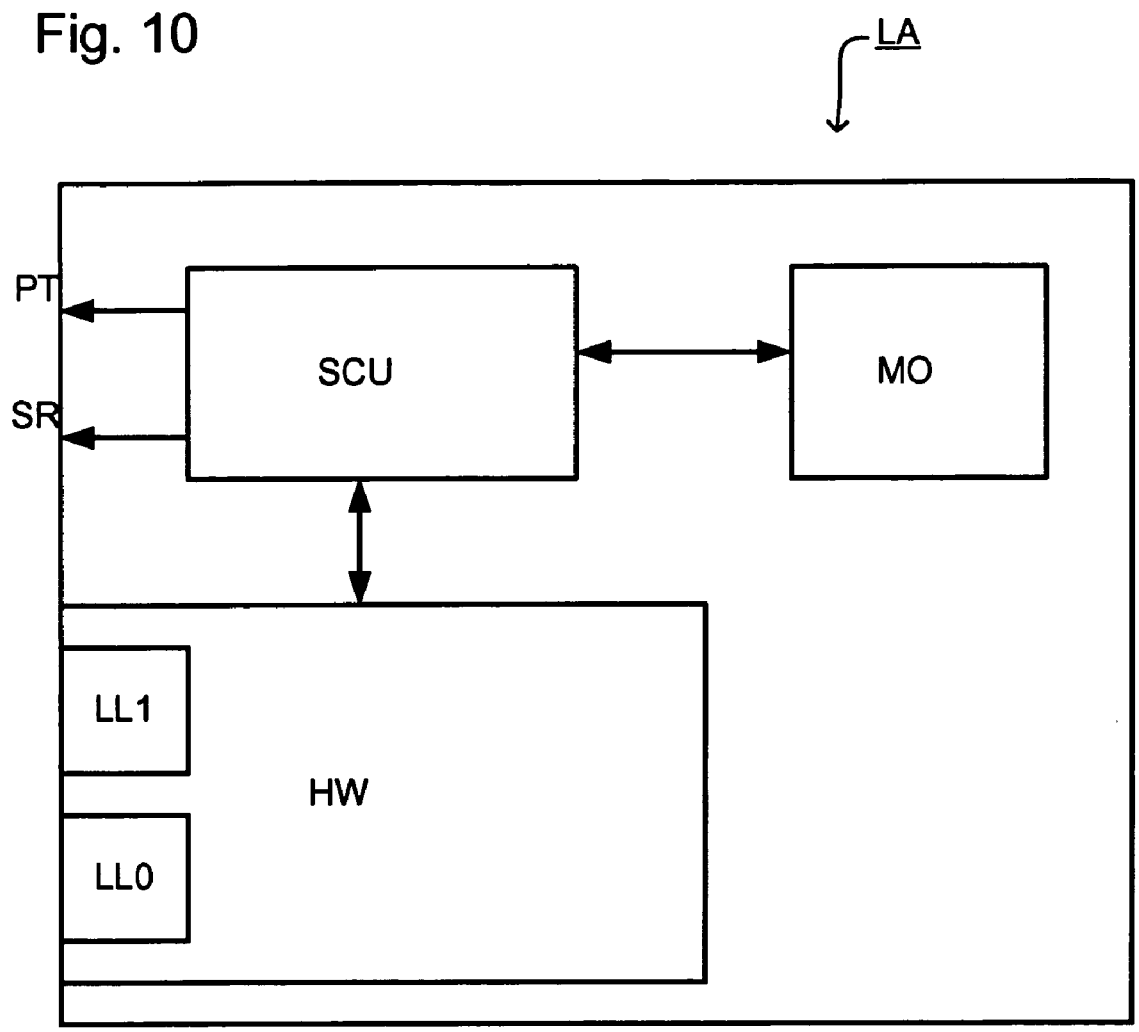
FIG. 10 depicts control arrangements in a lithographic apparatus according to the present invention and including a model.

The second multiple lots experiment is now repeated with the new model with the conveyer. The generator time is adjusted at the moment the first wafer of a new lot arrives at the exposure process. The conveyer will now delay the reaction of the track. In FIG. 9, the results are shown.

The results are that the throughput line does not follow the maximum throughput line. The delay caused by the conveyer belt, can be seen between wafer id 15 to 30. At wafer 16 the throughput had to rise to the maximal throughput however, this moment is delayed to wafer 29. Then the maximal throughput drops and the track becomes too fast. This means the steady state situation comes on the plateau, discussed above. The cycle misses of the track, can be seen as the peaks in the graph.

The buffer fills up because of the cycle misses. In the real machine, buffer management. Between wafers 60 and 75, the steady state behavior has passed the plateau and the track needs two cycles to pick up one wafer, which is highly inefficient.

As can be seen from the figure, the behavior of the system is extremely bad when a conveyer is added to the track model. This behavior is caused because the track robot gives wafers too fast or too slow to the wafer handler. A cycle time change at the generator is ordered by the controller. But because of the conveyer this cycle time change in the generator will have a delay before it appears at the interface between the track and the wafer handler. Also because the wafer lot size is 15 and the conveyer belt also contains about 15 wafers, the system cannot come to a correct steady state situation, which makes the results even worse. To obtain a better system behavior, TC has to schedule the moment it has to change the cycle time of the track.

Further improvement of the behavior of the complete lithocell can be obtained by predicting the cycle time of the lithographic apparatus, or the actual times substrates will be required. This prediction can be based on schedules obtained by methods described in European Patent Application No. 03256456.9 filed 13 Oct. 2003 and U.S. patent application Ser. No. 10/743,320 filed 23 Dec. 2003 which documents are hereby incorporated by reference.

Alternatively or in addition, a model of the lithographic apparatus may be used, to determine the times taken to executed untimed schedules or to simulate unscheduled behavior of an apparatus. As shown in FIG. 9, the lithographic apparatus LA may contain a supervisory control unit SCU, which controls the hardware of the lithographic apparatus, as well as a software model MO of the hardware, which is used to generate the predicted timings. A predicted timing signal PT can thus be sent to the track controller TC in addition to the substrate required signal SR indicating actual requirement for a prepared substrate.

Figure 11:
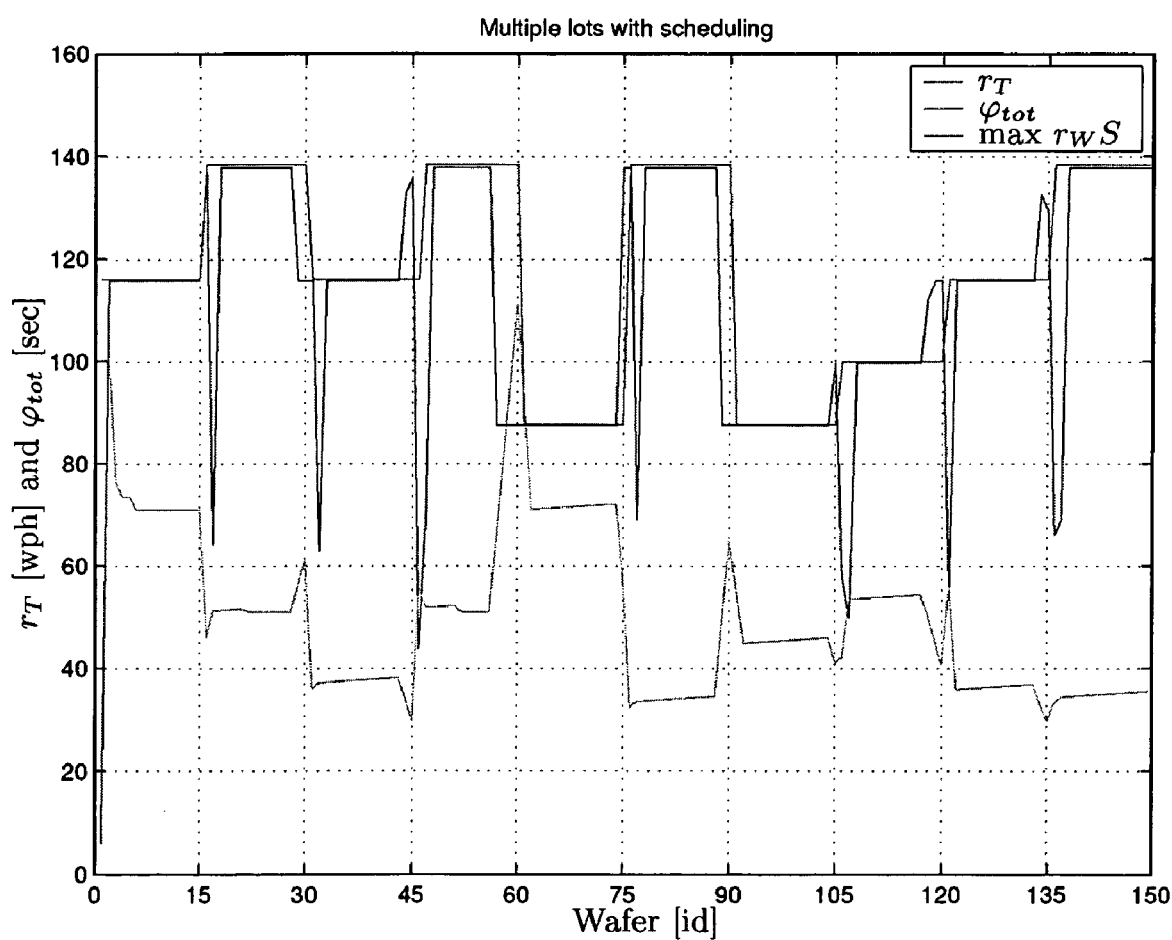
FIG. 11 depicts simulation results for a method according to the invention.

Introducing prediction of the cycle time for the lithographic apparatus produces improved results as shown in FIG. 11. This Figure represents the results of repeating the simulations of the 10 standard lots employing prediction of the cycle time with a "sixth wafer" rule as discussed above—the generation time of the seventh wafer is linked to the process time of the first wafer. This means that wafer seven and further of a new lot need to be generated with the generation time of that new lot. The first six wafers are generated with the generation time of the previous lot.

However, by using this technique another problem is introduced: one has to know in advance the amount of wafers in the buffer at the moment this seventh wafer comes to TR. This information is needed at the moment this seventh wafer is generated, meaning about 15 wafers in advance. Because this is almost impossible to predict, buffer management is introduced in the track. This buffer management works as follows. When a wafer is placed in a buffer, an extra delay in the generator is created, so TR has a chance to get this wafer out of the buffer. Because of the delay caused by the conveyer, this happens about 15 wafers later. By using this technique, it can be assumed that the buffer is empty at all times. The maximal error caused by this assumption is just one or two wafers, which is considered acceptable.

In FIG. 11, the throughput improved and the PEB time more stable than in FIG. 9. The form of the lines is almost the same as in FIG. 6, the simulation results without the conveyer in the track. This means that by scheduling the generation times of wafers, the behavior improves and the problems which are caused by the reaction delay in the track are overcome.

Whilst specific embodiments of the invention have been described above, it will be appreciated that the invention may be practiced otherwise than as described. As such, the description is not intended to limit the invention. The configuration, operation, and behavior of the present invention has been described with the understanding that modifications and variations of the embodiments are possible, given the level of detail present herein. Thus, the preceding detailed description is not meant or intended to, in any way, limit the invention—rather the scope of the invention is defined by the appended claims.

What is claimed is:

1. A method of controlling a track apparatus in a lithocell apparatus arrangement wherein said lithocell apparatus arrangement includes a lithographic exposure apparatus configured to expose substrates and the track apparatus configured to prepare substrates before exposure and develop substrates after exposure, said method comprising:
   predicting times at which said lithographic exposure apparatus will be available to accept a prepared substrate for exposure from said track apparatus; and
   adjusting a rate at which said track apparatus prepares substrates so that a substrate is prepared in time for acceptance by said lithographic exposure apparatus.

2. The method of claim 1, wherein said track rate is adjusted by delaying times when said track apparatus accepts substrates for preparation.

3. The method of claim 1, wherein said predicted times is based on a calculated schedule.

4. The method of claim 3, wherein said calculated schedule is based on a model.

5. The method of claim 1, wherein said predicted times is based on at least one of statistical data and empirical data.

6. The method of claim 1, further comprising predicting times when said lithographic exposure apparatus will deliver an exposed substrate to said track apparatus.

7. The method of claim 1, wherein said track apparatus rate is adjusted in response to a predicted demand timing for the substrate at least N substrates ahead of the substrate most recently accepted by said lithographic exposure apparatus, where N is the number of substrates undergoing preparation in said track apparatus.

8. The method of claim 1, further including a controller for controlling said exposure of substrates, wherein said controller comprises a prediction unit for providing said predicted times.

9. The method of claim 1, further including a controller for controlling said track rate and adjusting said track rate in response to predicted times.

10. The method of claim 1, wherein said adjusting includes adjusting a duration of a step of a recipe used to prepare the substrate.

11. A device manufacturing method, comprising:
   preparing a substrate for exposure in a track apparatus; and
   exposing a desired pattern onto said prepared substrate using an associated lithographic exposure apparatus;
   predicting times at which said lithographic exposure apparatus will be available to accept a prepared substrate for exposure from said track apparatus; and
   adjusting a rate at which said track apparatus prepares substrates so that a substrate is prepared in time to be accepted by said lithographic exposure apparatus.

12. The device manufacturing method of claim 11, wherein said predicted times is based on a calculated schedule.

13. The device manufacturing method of claim 11, wherein said calculated schedule is based on a model.

14. The device manufacturing method of claim 11, wherein said predicted times is based on at least one of statistical data and empirical data.

15. The device manufacturing method of claim 11, further comprising predicting times when said lithographic exposure apparatus will deliver an exposed substrate to said track apparatus.

16. The device manufacturing method of claim 11, wherein said track apparatus rate is adjusted in response to a predicted demand timing for the substrate at least N substrates ahead of the substrate most recently accepted by said lithographic exposure apparatus, where N is the number of substrates undergoing preparation in said track apparatus.

17. The device manufacturing method of claim 11, further including controlling said exposure of substrates with a controller, wherein said controller comprises a prediction unit for providing said predicted times.

18. The device manufacturing method of claim 11, further including controlling said track rate and adjusting said track rate in response to said predicted times.

19. A lithocell apparatus arrangement, comprising:
a lithographic exposure apparatus configured to expose substrates by exposing a desired pattern onto said substrate;
an associated track apparatus configured to prepare substrates before exposure and develop substrates after exposure; and
a controller configured to control said exposure of substrates and control a rate at which said track apparatus prepares substrates,
wherein said controller is configured to predict times at which said lithographic exposure apparatus will be available to accept a prepared substrate for exposure from said track apparatus and is configured to adjust said track rate so that a substrate is prepared in time for acceptance by said lithographic exposure apparatus.

20. The lithocell apparatus arrangement of claim 19, wherein said predicted times provided by said controller are based on a calculated schedule.

21. The lithocell apparatus arrangement of claim 20, wherein said calculated schedule is based on a model.

22. The lithocell apparatus arrangement of claim 19, wherein said predicted times provided by said controller are based on at least one of statistical data and empirical data.

23. The lithocell apparatus arrangement of claim 19, wherein said controller is further configured to predict times when said lithographic exposure apparatus will deliver an exposed substrate to said track apparatus.

24. The lithocell apparatus arrangement of claim 19, wherein said controller adjusts said track apparatus rate in response to a predicted demand timing for the substrate at least N substrates ahead of the substrate most recently accepted by said lithographic exposure apparatus, where N is the number of substrates undergoing preparation in said track apparatus.

25. A computer program comprising a computer-readable storage medium having recorded thereon executable instructions that are adapted to control at least part of a lithocell apparatus arrangement, wherein said lithocell apparatus arrangement comprises a track apparatus for preparing substrates for exposure and developing exposed substrates and an associated lithographic exposure apparatus for exposing substrates, said executable instructions comprising:
predicting times at which said lithographic exposure apparatus will be available to accept a prepared substrate for exposure from said track apparatus; and
adjusting a rate at which said track apparatus prepares substrates so that a substrate is prepared in time for acceptance by said lithographic exposure apparatus.

26. The computer program of claim 25, wherein said track rate is adjusted by delaying times when said track apparatus accepts substrates for preparation.

27. The computer program of claim 25, wherein said predicted times is based on a calculated schedule.

28. The computer program of claim 27, wherein said calculated schedule is based on a model.

29. The computer program of claim 25, wherein said predicted times is based on at least one of statistical data and empirical data.

30. The computer program of claim 25, further comprising predicting times when said lithographic exposure apparatus will deliver an exposed substrate to said track apparatus.

31. The computer program of claim 25, wherein said track apparatus rate is adjusted in response to a predicted demand timing for the substrate at least N substrates ahead of the substrate most recently accepted by said lithographic exposure apparatus, where N is the number of substrates undergoing preparation in said track apparatus.

* * * * *